United States Patent
Oda et al.

(10) Patent No.: US 7,259,813 B2
(45) Date of Patent: Aug. 21, 2007

(54) LIQUID CRYSTAL DISPLAY APPARATUS HAVING INSULATED REFLECTIVE LAYER AND MANUFACTURING METHOD THEREOF

(75) Inventors: Nobuhiko Oda, Hashima (JP); Satoshi Ishida, Ohgaki (JP); Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/330,924

(22) Filed: Dec. 27, 2002

(65) Prior Publication Data

US 2003/0156240 A1 Aug. 21, 2003

(30) Foreign Application Priority Data

Dec. 28, 2001 (JP) ............................ 2001-401026

(51) Int. Cl.
*G02F 1/1335* (2006.01)
(52) U.S. Cl. .................... 349/113; 349/43; 349/114; 349/138
(58) Field of Classification Search ............ 349/113, 349/114, 43, 44, 138, 47; 257/59, 72
See application file for complete search history.

(56) References Cited

U.S. PATENT DOCUMENTS

| | | | |
|---|---|---|---|
| 5,633,738 A * | 5/1997 | Wakui et al. .................. 349/46 |
| 5,689,320 A * | 11/1997 | Okada et al. ................ 349/135 |
| 5,764,324 A | 6/1998 | Lu et al. |
| 5,892,563 A | 4/1999 | Ono et al. |
| 5,926,240 A | 7/1999 | Hirota et al. |
| 5,949,507 A | 9/1999 | Shimada et al. |
| 5,956,105 A * | 9/1999 | Yamazaki et al. ............. 349/43 |
| 6,104,450 A | 8/2000 | Hiraishi |
| 6,168,980 B1 * | 1/2001 | Yamazaki et al. ........... 438/162 |
| 6,222,315 B1 | 4/2001 | Yoshizawa et al. |
| 6,236,440 B1 | 5/2001 | Johnson et al. |

(Continued)

FOREIGN PATENT DOCUMENTS

EP 1 122 585 A1 8/2001

(Continued)

OTHER PUBLICATIONS

International Search Report for EP 02 25 9009 dated May 6, 2003.

(Continued)

*Primary Examiner*—Andrew Schechter
*Assistant Examiner*—Michael H. Caley
(74) *Attorney, Agent, or Firm*—Cantor Colburn LLP

(57) ABSTRACT

On a first substrate are formed a TFT provided to each pixel, an insulating film which covers the TFT, and a reflective layer which is provided on the insulating film so as to be insulated from the TFT and reflects light incident from a second substrate side. The reflective layer is covered with a passivation film on which a first electrode made of a transparent conductive material, such as ITO having the work function equivalent to a second electrode, is formed and connected to the TFT. The passivation film covering the reflective layer prevents the reflective surface of the reflective layer from deteriorating in reflection properties during a process for connecting the TFT and the first electrode. Further, the first and second electrodes having similar characteristics can symmetrically AC drive the liquid crystal layer.

16 Claims, 5 Drawing Sheets

U.S. PATENT DOCUMENTS

| | | | |
|---|---|---|---|
| 6,249,330 B1* | 6/2001 | Yamaji et al. | 349/122 |
| 6,466,280 B1* | 10/2002 | Park et al. | 349/43 |
| 6,509,942 B2* | 1/2003 | Tanaka et al. | 349/113 |
| 6,563,554 B2 | 5/2003 | Okamoto et al. | |
| 6,567,141 B1* | 5/2003 | Kaneko et al. | 349/117 |
| 6,583,840 B1* | 6/2003 | Inoue et al. | 349/141 |
| 6,693,698 B2 | 2/2004 | Marshall et al. | |
| 6,697,138 B2* | 2/2004 | Ha et al. | 349/114 |
| 6,720,944 B1 | 4/2004 | Ishii et al. | |
| 6,809,785 B2 | 10/2004 | Fujino | |
| 2001/0020991 A1 | 9/2001 | Kubo et al. | 349/113 |
| 2001/0052948 A1 | 12/2001 | Okamoto et al. | 349/12 |
| 2002/0130991 A1 | 9/2002 | Kamijo | |
| 2005/0001961 A1 | 1/2005 | Koma et al. | |
| 2005/0062042 A1 | 3/2005 | Hayashi et al. | |

FOREIGN PATENT DOCUMENTS

| | | |
|---|---|---|
| JP | 7333598 | 12/1995 |
| JP | 8-184824 | 7/1996 |
| JP | 11101992 | 4/1999 |
| JP | 2000-122096 | 4/2000 |
| JP | 2001043980 | 2/2001 |
| JP | 2001085163 | 3/2001 |
| JP | 2001-125096 | 5/2001 |
| JP | 2002-521718 | 7/2002 |
| JP | 2002-365664 | 12/2002 |
| WO | WO 00/05601 | 2/2000 |
| WO | WO 00/05621 | 2/2000 |

OTHER PUBLICATIONS

English Translation of Japanese Patent-Laid Open Publication No. Hei 7-333598 dated Dec. 22, 1995.

English Translation of Japanese Patent Laid-Open Publication No. Hei 11-101992 dated Apr. 13, 1999.

Office Action for U.S. Appl. No. 10/376,721, dated Sep. 9, 2004.

European Search Report, European Patent Application No. 02259010.3-2205, Date of Mailing, Sep. 16, 2003.

Patent Abstracts of Japan, Publication No. 2001312253, dated Nov. 9, 2001 (1 page).

A copy of USPTO Office Action for U.S. Appl. No. 10/330,905 dated Dec. 2, 2004.

A copy of USPTO Office Action for U.S. Appl. No. 10/330,998 dated Dec. 2, 2004.

Copy of excerpt English translation of Japanese Patent Laid-Open Publication No. Hei 10-333169, cited in related Korean patent application No. 10-2002-0084948.

Coop of Office Action for corresponidng Korean patent application No. 10-2002-008498 with English excerpt translation, Copy of Japanese Laid-Open Publication No. Hei 10-333168 with English abstract.

Office Action dated Mar. 24, 2006, for related U.S. Appl. No. 10/330,998.

Office Action dated Feb. 28, 2006 for related U.S. Appl. No. 10/330,905.

Office Action dated Dec. 14, 2005 for related U.S. Appl. No. 10/376,721.

Notice of Grounds for Rejection for Japanese Patent Application No. 2001-400996 with English translation dated Dec. 5, 2006.

Notice of Grounds for Rejection for Japanese Patent Application No. 2001-401026 with English translation dated Dec. 5, 2006.

* cited by examiner

LIQUID CRYSTAL DISPLAY APPARATUS HAVING INSULATED REFLECTIVE LAYER AND MANUFACTURING METHOD THEREOF

BACKGROUND OF THE INVENTION

1. Field of the Invention

The present invention relates to a reflective or transflective display apparatus or the like having a reflective function.

2. Description of Related Art

Liquid crystal display apparatuses (hereinafter referred to as "LCDs") are advantageous in that they are thin and consume relatively little power, and have been widely used for computer monitors and monitors for portable information devices or the like. In LCDs, liquid crystal is sealed between a pair of substrates each having an electrode formed thereon, and the orientation of the liquid crystal disposed between these electrodes is controlled by these electrodes to thereby achieve display. Contrary to CRT (Cathode Ray Tube) displays, electroluminescence (hereinafter referred to as "EL") displays or the like, LCDs require a light source in order to display an image for viewer observation, because LCDs are not, in principle, self-emissive.

Transmissive LCDs, in which a transparent electrode is used as an electrode formed on each substrate and a light source is disposed on the rear or side of the LC panel, can provide bright display even in a dark environment, by controlling the transmission amount of light from the light source through the LC panel. Transmissive LCDs, however, have disadvantages in that power consumption is relatively high due to the light source which must continually illuminate, and that sufficient contrast cannot be ensured when the display is used in a bright environment, such as outdoors under daylight.

In reflective LCDs, on the other hand, external light such as sunlight and room light is used as a light source, and such an ambient light entering the LCD panel is reflected by a reflective electrode formed on the substrate provided on the non-viewing surface side. Thus, light enters through the liquid crystal layer, is reflected by the reflective electrode, and then exits from the LCD panel. By controlling the amount of light radiating from the LCD panel for each pixel, reflective LCDs display an image. While reflective LCDs, which use external light as a light source, differ from LCDS in that their display is dark or black when no such external light is available, they have advantages that power consumption is very low because the power required for the light source can be eliminated and that sufficient contrast can be obtained in the bright environment such as outdoors. Conventional reflective LCDs, however, have been inferior to transmissive LCDs with regard to general display qualities such as color reproductivity and display brightness.

On the other hand, with an increasing demand for reduced power consumption of a device, reflective LCDs, which are more advantageous than transmissive LCDs with respect to power consumption, have been tested for application as highly resolution monitors of portable devices and studied and developed for quality improvement.

FIG. 1 is a plan view showing one pixel portion of a conventional active matrix reflective LCD in which a thin film transistor (TFT) is provided for each pixel. FIG. 2 schematically shows a cross sectional configuration of the reflective LCD taken along line C—C of FIG. 1.

The reflective LCD comprises a first substrate 100 and a second substrate 200 which are adhered to each other with a predetermined gap therebetween and a liquid crystal layer 300 sealed between the first and second substrates. A glass or plastic substrate is used for the first and second substrate 100 and 200, while a transparent substrate is used as the second substrate 200 located on the viewer side, at least in this example.

On the side facing the liquid crystal layer of the first substrate 100, a thin film transistor (TFT) 110 is formed for each pixel. In this TFT 110, for example, a drain region in an active layer 120 is connected with a data line 136 which supplies a data signal to each pixel via a contact hole formed in an inter-layer insulating film 134. A source region of the TFT 110 is connected with a first electrode (pixel electrode) 150 which is individually formed for each pixel via a contact hole formed to penetrate the inter-layer insulating film 134 and a planarization insulating film 138.

A material having a reflective function, such as Al, Ag, or the like, is employed as the first electrode 150. On the reflective electrode 150, an alignment film 160 is formed so as to control the initial alignment of the liquid crystal layer 300.

When the LCD is a color LCD, on the side facing the liquid crystal layer of the second substrate 200, which is disposed so as to oppose to the first substrate 100, a color filter (R, G, B) 210 is formed, and a transparent electrode 250 comprising a transparent conductive material such as ITO (Indium Tin Oxide) is formed on the color filter 210. Further, on the transparent electrode 250, an alignment film 260 which is similar to the alignment film 160 on the first substrate side is formed.

In the reflective LCD configured as described above, the amount of light which enters the liquid crystal panel, is reflected by the reflective electrode 150, and radiates from the liquid crystal panel, is controlled for each pixel, to thereby produce a desired display.

In LCDs, not limited to the reflective LCD, the liquid crystal is driven by an alternating voltage so as to prevent image persistence. With regard to transmissive LCDs, as both the first electrode on the first substrate and the second electrode on the second substrate should be transparent, ITO is used as a material for both electrodes. Consequently, for AC driving of the liquid crystal, each of the first and second electrodes can apply a positive or negative voltage on substantially the same conditions.

However, in the reflective LCD as shown in FIG. 2, in which a reflective electrode formed by a metal material is used as the first electrode 150 and a transparent electrode formed by a transparent metal oxidation material such as ITO is used as the second electrode 250, certain problems such as display flicker and image persistence in the liquid crystal layer may occur depending on the drive conditions. These problems are noticeable when the liquid crystal is driven at a frequency less than the critical flicker frequency (CFF), for example, which has been reported recently. In order to further reduce power consumption of LCDs, attempts have been made to reduce the frequency for driving the liquid crystal (≈the frequency for writing data to liquid crystal (liquid crystal capacitor) at each pixel formed in the region where the first and second electrodes face each other) equal or less than the CFF at which image flicker can be recognized by a human eye, approximately 40 Hz–30 Hz, by reducing such a drive frequency to less than 60 Hz which is a reference frequency in the NTSC standard, for example. It has been revealed, however, that when each pixel of a conventional reflective liquid crystal panel is driven at less than the CFF, the above-described problems of flicker and image persistence in the liquid crystal layer are significant, which leads to significant deterioration in display quality.

The applicant's research for the causes of such flicker and image persistence in the liquid crystal layer generated in a reflective LCD as shown in FIGS. 1 and 2 revealed that asymmetricity of the electrical characteristics of the first and second electrodes relative to the liquid crystal layer 300 is one cause. It is believed that such asymmetricity results from a significant difference between a work function of 4.7 eV~5.2 eV for the transparent metal oxide such as ITO used in the second electrode 250 and a work function of 4.2 eV~4.3 eV for the metal such as Al used in the first electrode 150. Such a difference in the work function would cause there to be a difference of a charge actually induced on the liquid crystal interface via the alignment films 160 and 260, when the same voltage is applied to each electrode. Such a difference of charge induced on the interface between the liquid crystal and the alignment layer at each electrode side would then cause impurity ions or the like to be unevenly located toward only one electrode within the liquid crystal layer, which results in accumulation of remaining DC voltage in the liquid crystal layer 300. As the liquid crystal drive frequency is lowered, the influence of this remaining DC voltage on the liquid crystal increases and generation of flicker and image persistence in the liquid crystal layer becomes more significant. Accordingly, driving the liquid crystal at a frequency not greater than the CFF, in particular, is substantially difficult.

Reflective LCDs in which ITO is used for both the first and second electrodes as in transmissive LCDs and a reflector is separately provided on the outer side of the first electrode (on the side of the first electrode not facing the liquid crystal) are conventionally known. When a reflector is thus provided on the outer side of the fist substrate, however, the length of a light path is increased by an amount corresponding to the thickness of the transparent first electrode 150 and of the transparent first substrate, thereby making the display quality likely to deteriorate due to parallax. Consequently, in reflective LCDs which demand high display quality, a reflective electrode is employed as a pixel electrode, and it is therefore impossible to reduce the drive frequency so as to achieve lower power consumption, because flicker or the like is generated at the lower drive frequency, as described above.

SUMMARY OF THE INVENTION

The present invention was conceived in view of the aforementioned problems of the related art and achieves a display apparatus free from effect of flicker and parallax and having a reflective function which provides high display quality and relatively low power consumption, in which electrical properties of the first and second electrodes are equal.

In order to attain the above-described advantage, the present invention provides a display apparatus configured by providing a liquid crystal layer between a first substrate having a first electrode and a second substrate having a second electrode. The first substrate further comprises a switching element provided to each pixel, a reflective layer formed on a insulating film which covers said switching element so as to be insulated from the switching element, the reflective layer reflecting light incident from the second substrate and the second electrodes, both of which are transparent, and a passivation film formed so as to cover the reflective layer. In the first substrate, the first electrode made of a transparent conductive material is electrically connected to the switching element via a contact hole formed through the passivation film and insulating film in a region corresponding to the switching element.

As described above, the transparent first electrode having characteristics similar to the second electrode on the second substrate is laid out at a location to the liquid crystal layer than is the reflective layer , whereas the reflective layer insulated from the switching element and covered with the passivation film is placed under the first electrode and on the insulating film, such as an inter-layer insulating film or a planarization insulating film covering the switching element. A structure as described makes it possible for the liquid crystal layer to be symmetrically driven by the first electrode connected to the switching element on each pixel and the second substrate. Even when a driving frequency for the liquid crystal layer on each pixel is set to a value lower than 60 Hz, because the first and the second electrodes are similar in electrical structure, high-quality display without flicker can be achieved. Because the reflective layer covered with the passivation film prevents the reflective layer from deteriorating when the first electrode is connected the switching element, a display apparatus having desired reflection properties can be obtained.

In another aspect of the present invention, in the above-described display apparatus, the switching element is a thin film transistor comprising an active layer formed of silicon, and the first electrode directly contacts with the active layer of the thin film transistor.

In still another aspect of the present invention, the difference between the work function of the transparent conductive material used for the first electrode and the work function of the transparent conductive material used for the second electrode formed on the liquid crystal layer side of the second substrate is equal to or lower than 0.5 eV in the above display apparatus.

In another aspect of the present invention, a method for manufacturing a display apparatus configured by sandwiching a liquid crystal layer between a first substrate comprising a transparent first electrode and a second substrate comprising a transparent second electrode is provided. The method for manufacturing the display apparatus comprises steps of forming a thin film transistor on the first substrate, covering the thin film transistor to form at least a single-layer insulating film, covering the insulating film to form a reflective material layer which is then patterned in such a manner that the reflective material layer remains on a predetermined pixel region other than a region corresponding to the active layer of the thin film transistor to form a reflective layer, covering the reflective layer to form a passivation film, forming a contact hole which penetrates the passivation film and the insulating film on the region corresponding to the active layer of the thin film transistor so as to expose the active layer, and covering the passivation film and the exposed active layer with transparent conductive material to form the first electrode which is then connected to the active layer through the contact hole.

As described above, by covering the reflective layer with the passivation film in the structure wherein the first electrode is placed on a place which is nearer than the reflective layer in distance to the liquid crystal side, it becomes possible to establish reliable connection between the first electrode and the active layer while preventing deterioration of reflective properties due to exposure of the reflective surface of the reflective layer during subsequent etching process at the time of connection between the first electrode and the active layer of the thin film transistor.

DESCRIPTION OF THE PREFERRED EMBODIMENT

A preferred embodiment of the present invention will be described below with reference to the drawings.

Figure 3A:
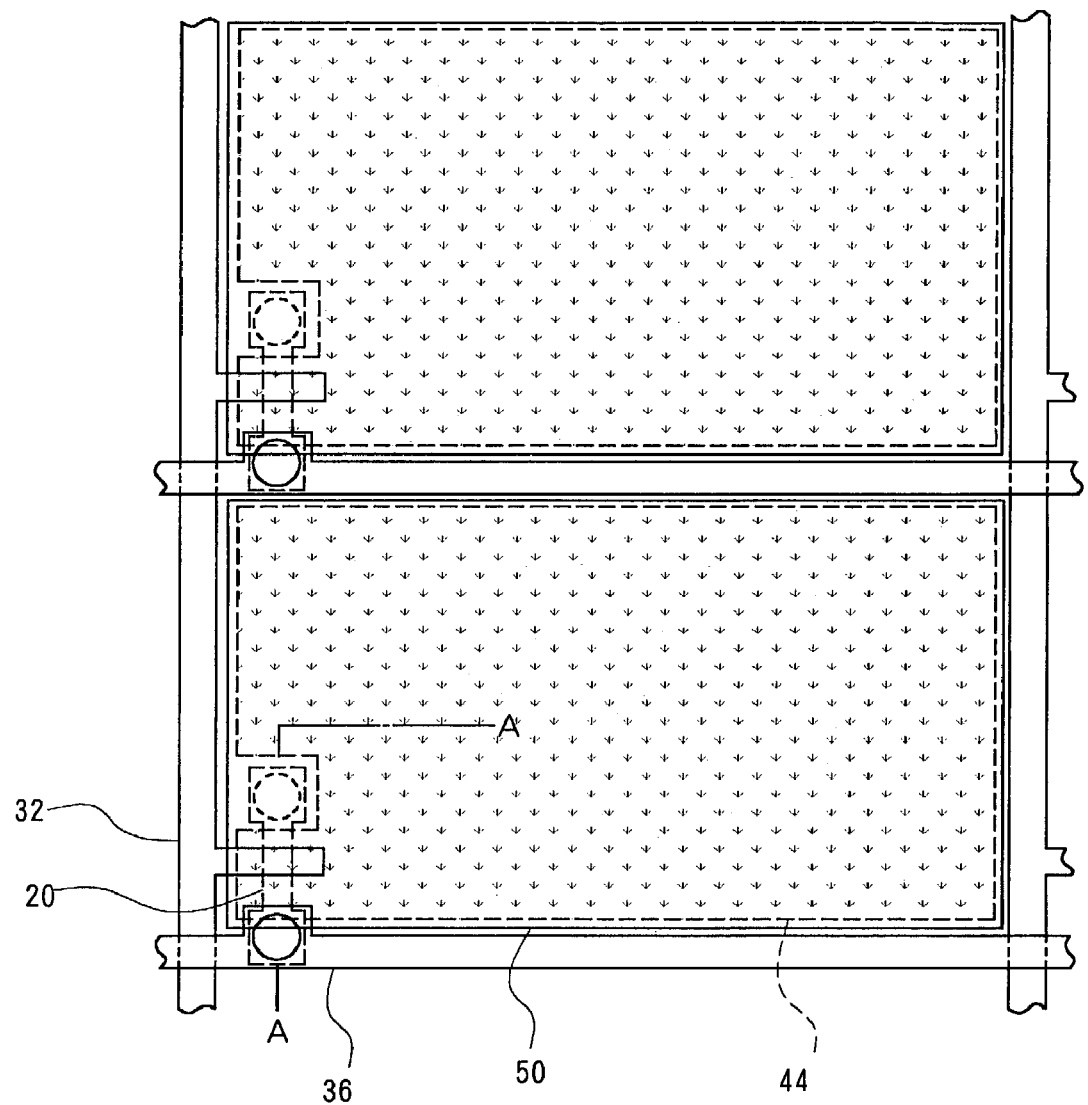
FIG. 3A is a schematic plan view of a structure on a first substrate side of an active matrix reflective LCD according to an embodiment of the present invention.
Figure 3B:
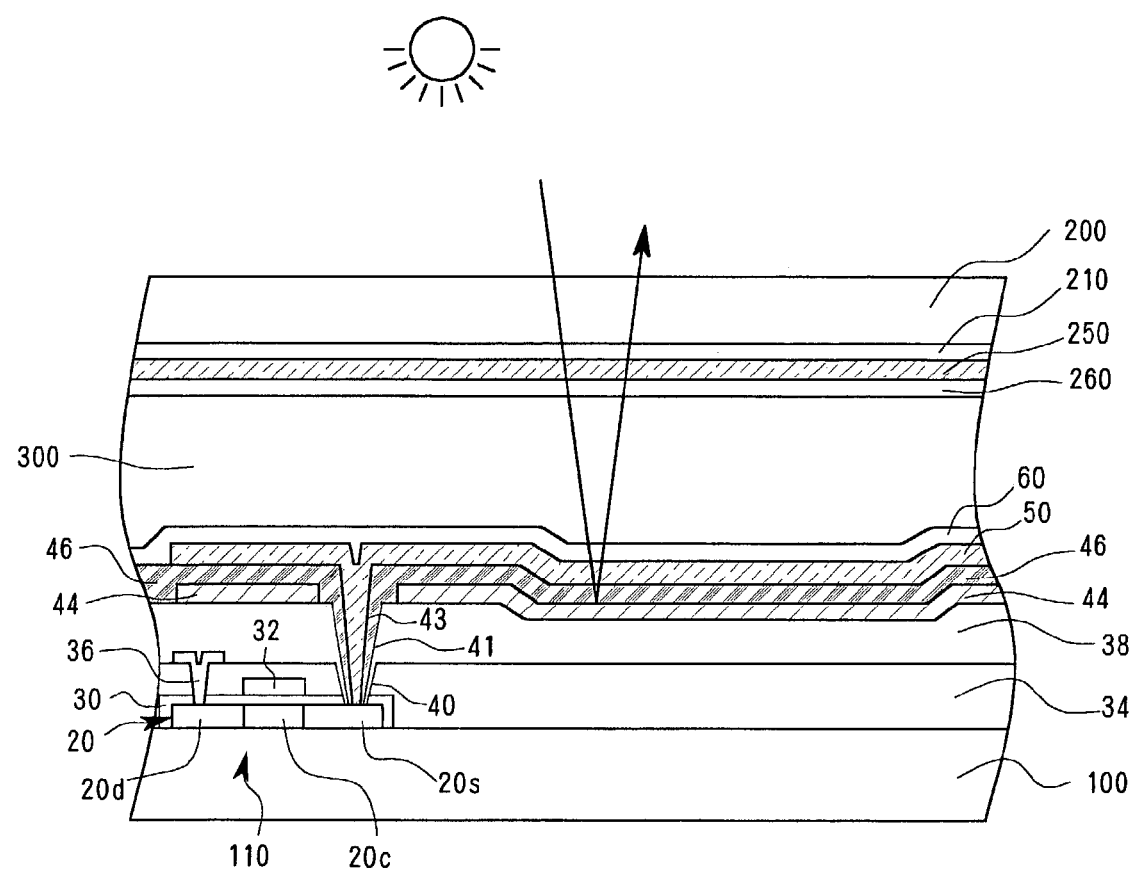
FIG. 3B is a schematic cross-sectional view of the structure of the reflective LCD of FIG. 3A along line A—A.

FIG. 3A shows a plan view of a portion of the structure on a first substrate side of a reflective active matrix LCD as a reflective LCD according to the present embodiment, and FIG. 3B shows a schematic cross-sectional view of the structure of the reflective LCD along line A—A in FIG. 3A. In an active matrix type LCD, a plurality of pixels, each having a TFT 110 as a switching element, are provided in a display region in a matrix form. The TFTs 110 formed on a pixel basis on either one of the first and second substrates, for example, on the side of first substrate 100, each connected to one of pixel electrodes (first electrodes) 50 formed in individual patterns.

A transparent substrate such as glass is used for the first and second substrate 100 and 200. When the LCD is a color LCD, a color filter 210 is formed on the side of the second substrate 200 facing the first substrate 100, as in the conventional LCD. On the color filter 210, a second electrode 250 made of a transparent conductive material such as IZO (Indium Zinc Oxide) or ITO is formed. In an active matrix LCD, the second electrode 250 is formed as a common electrode for all pixels. Further, on the second electrode 250, an alignment film 260 made of polyimide or the like is formed.

According to the present embodiment, the apparatus on the second substrate side configured as described above employs an electrode structure whose electrical property is similar to that of an electrode on the first substrate with regard to the liquid crystal layer 300. More specifically, as shown in FIG. 3B, the first electrode 50 which is made of a material having a work function similar to that of the second electrode 250, that is, a transparent conductive material as used in the second electrode 250 such as IZO and ITO, and not a reflective metal electrode as conventionally employed, is formed immediately under an alignment film 60 on the first substrate 100. Then, in order to create a reflective LCD, a reflective layer 44 which reflects incident light entering through the second substrate 200 is formed under the first electrode 50.

By forming the first electrode 50 of the same material as used for the second electrode 250, electrodes having the same work function sandwich the liquid crystal layer 300, via the alignment layers 60 and 260, respectively, so that the liquid crystal layer 300 can be AC driven by the first and second electrodes 50 and 250 with very good symmetry. Here, the work functions of the first and second electrodes 50 and 250 need not be completely identical and may be as approximate to each other as possible so that the liquid crystal layer 300 can be symmetrically driven. When the difference between the work functions of the both electrodes is approximately 0.5 eV or less, high quality display without flicker or image persistence in the liquid crystal layer can be achieved, even when the drive frequency for the liquid crystal is set to CFF or lower, as described above.

In order to satisfy the above conditions for the electrodes, for example, IZO (whose work function is 4.7 eV~5.2 eV) can be used for the first electrode 50 and ITO (whose work function is 4.7 eV~5.0 eV) can be used for the second electrode 250, or vice versa. The material used for each electrode may be selected in consideration of process properties such as transmissivity and patterning precision and manufacturing cost.

With regard to the reflective layer 44, a material with good reflective property, such as Al, Ag, and alloys thereof (Al—Nd alloy is used in the present embodiment), is used at least on the top surface side (on the surface side toward the liquid crystal layer). While the reflective layer 44 may be a single layer made of a metal material such as Al, a layer made of a refractory metal (high melting point metal) such as Mo may be additionally provided as a lower buffer layer which contacts a planarization insulating film 38. With such a lower buffer layer, the adhesiveness between the reflective layer 44 and the planarization insulating film 38 can be enhanced to thereby improve the reliability of the device. In the configuration shown in FIG. 3B, the planarization insulating film 38 includes, within each pixel region, a slant surface formed at a desired angle, and the reflective layer 44 which is formed so as to cover the planarization insulating film 38 also has a similar slant portion on the surface. By forming such a slant surface at an optical angle and location, it is possible to collect and radiate outside light for each pixel, and therefore the display brightness at the front position of the display can be increased, for example. It should be understood, however, that such a slant surface need not necessarily be provided.

In this embodiment, a passivation film 46 is formed between the reflective layer 44 and the first electrode 50 so as to cover the reflective layer 44. The passivation film 46 is provided to protect the reflective layer 44. More specifically, the passivation film 46 has a function of protecting the reflective surface of the reflective layer 44 from etchant applied during slight etching to expose the active layer 20 at the bottom of the contact hole provided for connecting the active layer 20 of the TFT 110 to the first electrode 50.

Material of the passivation film 46 is not limited to those described above, such as a resin or $SiO_2$. Any other material or materials are acceptable as long as the material enables the passivation film 46 to protect the reflective layer 44 so as to maintain the reflection properties thereof during etching process. Further, film thicknesses on the scale of those capable of maintaining the protective function are acceptable for the passivation film 46. In order to obtain a flat surface on which the first electrode 50 is formed as an upper layer of the passivation film 46, use of materials capable of planarizing the upper surface, such as acrylic resin, is preferable. By selecting an optimum film thickness and a material capable of providing an optimum refractive index, the passivation film 46 can serve as an optical buffer layer capable of, for example, achieving colored compensation or increasing reflectivity.

Figure 1:
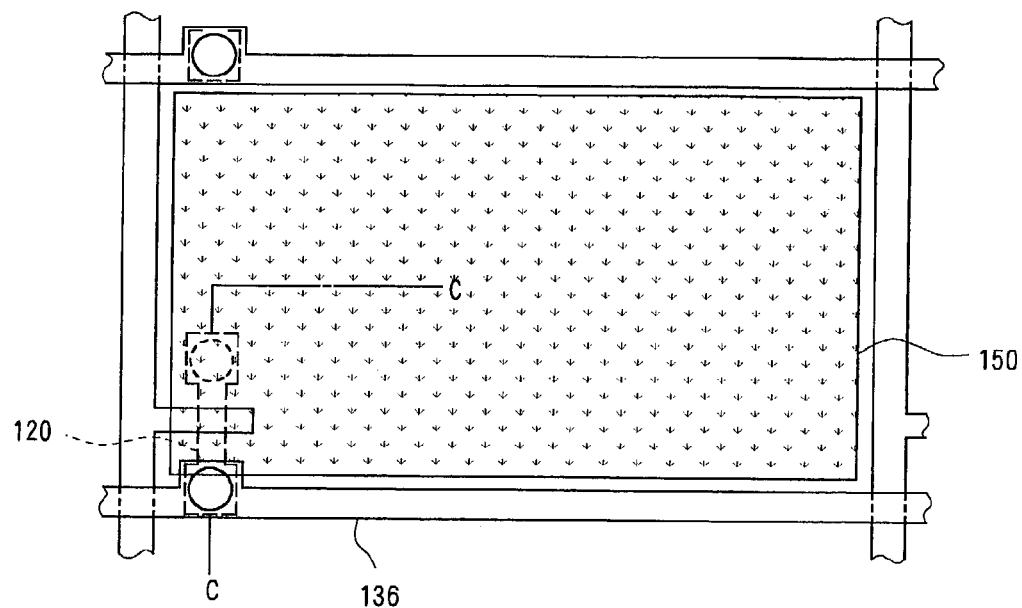
FIG. 1 is a plan view of a portion of the structure on a first substrate side in a related art active matrix reflective LCD.

The reflective layer 44 made of a conductive material, such as Al, is removed from a contact region where the TFT 110 and the first electrode 50 are connected in this embodiment. Such removal of the reflective layer 44 from the contact region solves the following problems:

(a) the surface of the reflective layer 44 made of a conductive material such as Al is prone to formation of a natural oxide film. Therefore it is not possible to connect the TFT 110 and the first electrode 50 in the contact region covered with the reflective layer 44 due to the natural oxide film formed on the reflective layer 44. In order to establish the connection, it is necessary to remove the natural oxide film formed on the reflective layer 44;

(b) when etching is performed to remove the natural oxide film from the reflective layer 44, the surface of the reflective layer 44, i.e. reflective surface, becomes coarse, thereby lowering the reflectivity; and (c) in order to remove the natural oxide film developed on the surface of the reflective layer 44 from only the contact region as a means of preventing a decreased reflectivity of the reflective layer 44, there arises a necessity for executing additional exposure/etching process using photolithography technology. Further, because the reflective layer 44 covered with the passivation film 46 as described above can prevent contact between the surface of the reflective layer 44 and the etchant applied to form the contact hole, it is possible to maintain appropriate reflective properties of the reflective layer 44 provided below the first electrode 50 in the structure wherein direct connection is established between the first electrode 50 and the FTF 110. It should be noted that, because it is insulated from both the first electrode 50 and the TFT 110, the reflective layer 44 need not necessarily be formed in an individual pattern as shown in FIG. 1, and may be formed in a pattern integrated for all pixels and having an opening in each pixel in a region corresponding to the second contact hole where the first electrode 50 is connected to the TFT 110.

In recent years, so-called transflective LCDs having both light transmission function and reflective function have been proposed. For such a transflective LCD, a configuration is known in which a pixel electrode such as ITO is first formed and a reflective electrode such as Al is then formed to cover a portion of the transparent electrode, as in the transmissive LCD. In a transflective LCD configured such that the transparent electrode layer and the reflective electrode layer are sequentially disposed in this order from the substrate side, these two electrode layers are electrically connected and function as a single pixel electrode. However, because, in this single pixel electrode, the reflective electrode is located toward the liquid crystal layer, due to the difference of work functions between this reflective electrode and the second electrode, the liquid crystal layer 300 cannot be symmetrically driven. While disposing the electrode layers in the reverse order in order to form a single pixel electrode so as to improve the symmetry in electrical properties may be considered, this approach does not solve the above problem. Specifically, as described above, a natural oxide film is likely to be formed on the surface of a metal material such as Al and Ag used for the reflective electrode. In particular, when such a metal layer which is formed undergoes sputtering for forming the transparent conductive material layer thereon, the metal layer is covered with a natural oxide film and is insulated from the transparent electrode. Consequently, even if the order of the electrodes is reversed, the liquid crystal cannot be driven by the transparent electrode on the first substrate side, and it is impossible to match the electrically properties of the first and second substrate sides with regard to the liquid crystal.

On the other hand, according to the present embodiment, liquid crystal can be driven in a state wherein the first electrode 50 capable of being connected to the TFT 110 with reliability is placed on the liquid crystal layer side, and the reflective layer 44 having a suitable reflective surface can be laid out below the first electrode 50, thereby providing a superior reflective LCD.

A structure in which the first electrode 50 is reliably connected to the corresponding TFT 110 as described above and a manufacturing method for realizing the structure will be described below.

According to the present embodiment, a top gate type TFT is adopted as the TFT 110 and polycrystalline silicon (p-Si) obtained by poly-crystallizing amorphous silicon (a-Si) through laser annealing is used for the active layer 20. However, the TFT 110 is not limited to a top gate p-Si TFT; the TFT 110 may be a bottom gate TFT and the active layer may be made a-Si. Although impurities of either n conductive type or p conductive type may be doped into source and drain regions 20s, 20d of the active layer 20 of the TFT 110, n conductive type impurities such as phosphorus are doped and a n-ch TFT is adopted as the TFT 110 in this embodiment.

After covering the active layer 20 of the TFT 110 with a gate insulating film 30 on which a gate electrode 32 made of Cr or the like is subsequently formed, the impurities are doped into the active layer 20 using the gate electrode 32 as a mask so that the source region 20s and drain region 20d are formed, as is a channel region 20c where the impurities are not doped. Next, an inter-layer insulating film 34 is formed so as to cover the entire first substrate. In this example, a first contact hole is formed on the region corresponding to the drain region of the inter-layer insulating film 34, and a second contact hole 40 is formed on the region corresponding to the source region by wet etching. Then, in this embodiment, a drain electrode 36 is formed on the drain region 20d of the active layer 20 made of p-Si by laminating and patterning drain electrode materials. The drain electrode 36 is shared as a data line to provide a data signal corresponding to display data to the TFT 110 connected the drain electrode 36 through a first contact hole.

After the drain electrode 36 is formed, the entire surface of the substrate surface including the second contact hole 40 which has already been formed is covered with a resin material such as an acrylic resin to form the planarization insulating film 38 made of the resin material. Next, the planarization insulating film 38 filled in the second contact hole 40 is selectively removed by wet etching so as to form a third contact hole 41 which overlaps with the second contact hole 42 and having a diameter which is slightly smaller than that of the second contact hole (because the material of the planarization insulating film covers the interior wall of the contact hole). After the third contact hole 41 is formed, a material, such as an Al—Nd alloy and Al, having appropriate reflection properties is laminated on the planarization insulating film 38 as the reflective layer 44, and is introduced into the third contact hole 41 by means of evaporation or sputtering. The laminated reflective material is partially removed from the third contact hole 41, the source region, and the vicinity thereof by etching so as not to interfere with the contact between the first electrode 50 and the source region 20s of the TFT 110. Upon completion of the etching, a reflective layer 44 having the pattern shown in FIG. 3A is formed on each pixel. In order to prevent leak current from occurring due to irradiation of light (especially on the channel area 20c) on the TFT 110, and to provide as large a reflectable region as possible, the reflective layer 44 is positively formed on the upper area of the channel of the TFT 110 as illustrated in FIG. 3A.

After completion of the formation and patterning of the reflective layer 44, the passivation film 46 made of the acrylic resin or the like is formed on the entire surface of the substrate covering the reflective layer 44. Then, the passivation film 46 filled in the third contact hole 41 is selectively removed by wet etching so as to form a fourth contact hole 43 which overlaps with the third contact hole 41 and having a diameter which is slightly smaller than that of the third contact hole 41 (because the material of the passivation film covers the interior wall of the contact hole). As a result, the source region 20s of the TFT 110 is exposed at the bottom of the fourth contact hole 43. Here, it should be noted that in a case where the first substrate 50 made of an ITO or the like directly contacts with the p-Si active layer 20 as described in this embodiment, the gate insulating film 30 of $SiO_2$ formed on the surface of the p-Si active layer 20 or the oxidation film formed on the surface of the p-Si active layer 20 which is exposed in the subsequent process should be reliably removed to lower contact resistance. On account of this, according to this embodiment, after the fourth contact hole 43 which penetrates the insulating film 46 filled in the third contact hole 43 is formed, slight etching is further performed on the fourth contact hole 43 using HF (hydrofluoric acid). Although the hydrofluoric acid also etches metal material such as Al used for the reflective layer 44, the passivation film 46 made with sufficient thickness to protectively cover the reflective layer 44 serves as a sacrificial layer during the slight etching preventing the surface of the reflective layer 44 from being exposed to such hydrofluoric acid or the like in this embodiment.

After the fourth contact hole 43 and etching are completed as described above, the transparent conductive layer is laminated on the entire surface of the substrate including the fourth contact hole area by sputtering. Because the reflective layer 44 made of, for example, Al has been covered with the passivation film 46 as described above, negligible natural oxide film is formed on the surface of the reflective layer during the sputtering. Even where and if some natural oxide film has formed, the electrical characteristics of the reflective layer 44 would not change when the present embodiment is employed because it is insulated from both the TFT 110 and the first electrode 50. Following the lamination, the transparent conductive layer formed on the entire substrate is patterned in a separate and distinct shape by a pixel as illustrated in FIG. 3A so that the pixel electrode (the first electrode) 50 connected to the active layer 20 of the TFT 110 via the fourth contact hole 43 is obtained. After the first electrode 50 is formed on each pixel region, the alignment film 60 made of polyimide or the like is formed so as to cover the entire surface of the substrate, thereby completing formation of a structure on the first substrate side. Then, the perimeters of the completed first substrate 100 and the second substrate on which forming process until the alignment film 260 has been completed are bonded while a predetermined gap is maintained between them, and then the space between the substrates is filled with liquid crystal to create a liquid crystal display apparatus. It should be noted that the manufacturing processes and the order in which they are applied are not limited to those explained above and other methods, for example, a method in which, instead of the second to fourth contact holes, a contact hole penetrating through all of the passivation film, the inter-layer insulating film, and the gate insulating film is formed in one process after the films until the passivation film 46 are laminated may be adopted.

Figure 4A:
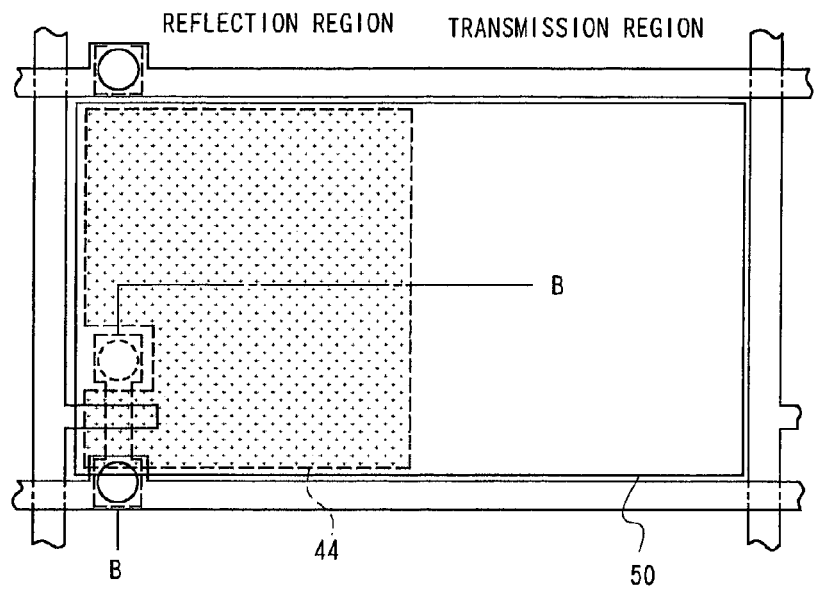
FIG. 4A is a schematic plan view of a structure on a first substrate side of an active matrix transflective according to the embodiment of the present invention.
Figure 4B:
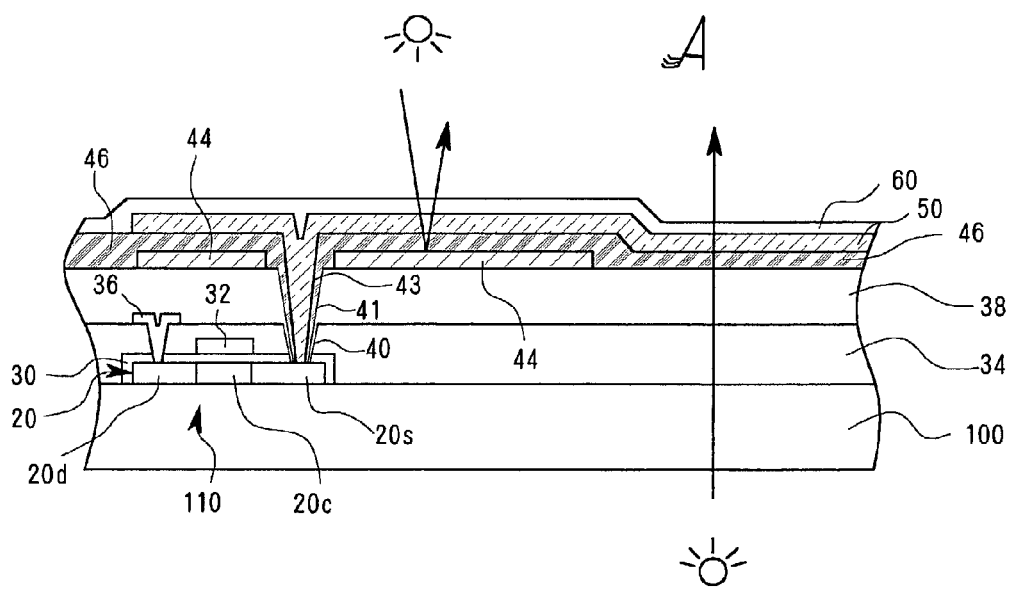
FIG. 4B is a schematic cross-sectional view of the structure of the transflective LCD of FIG. 4A along line B—B.

The transflective LCD will next be described. Although the reflective LCD in which the reflective layer 44 is formed on almost an entire pixel region was described as an example in the above, the present invention is not limited to reflective LCD applications, and may also be applied to a transflective LCD. FIG. 4A shows a plan view of a structure in one pixel of such a transflective active matrix LCD and FIG. 4B shows a schematic cross-sectional view of the structure along line B—B in FIG. 4A. In the reflective LCD described above with reference to FIGS. 3A and 3B, the reflective layer 44 is formed on almost all of one pixel region (except the region contacting with the TFT). On the other hand, in the transflective LCD which will be described with reference to FIGS. 4A and 4B, both a reflective region comprising the reflective layer 44, the passivation film 45, and the transparent first electrode 50 laminated thereon and a light transmitting region where the reflective layer 44 is removed, such that only the transparent first electrode 50 and the passivation film 56, which may or may not be removed, are formed within one pixel. Also in such a transflective LCD, the first electrode 50 is placed at a position where is nearer to the liquid crystal layer than the reflective layer 44 covered with the passivation film 46, and is removed from the contact region on which contact between the TFT 110 and the first electrode 50 is established. Accordingly, the TFT 110 can be reliably connected to the first electrode 50, and symmetrical AC driving of the liquid crystal layer 300 between the alignment films can be preformed by the first electrode 50 and the second electrode 250 having similar work functions. Of course, in the reflective region, light incident to the liquid crystal panel can be reflected by the reflective layer 44 provided under the first electrode 50 and having an appropriate reflective surface.

Figure 5:
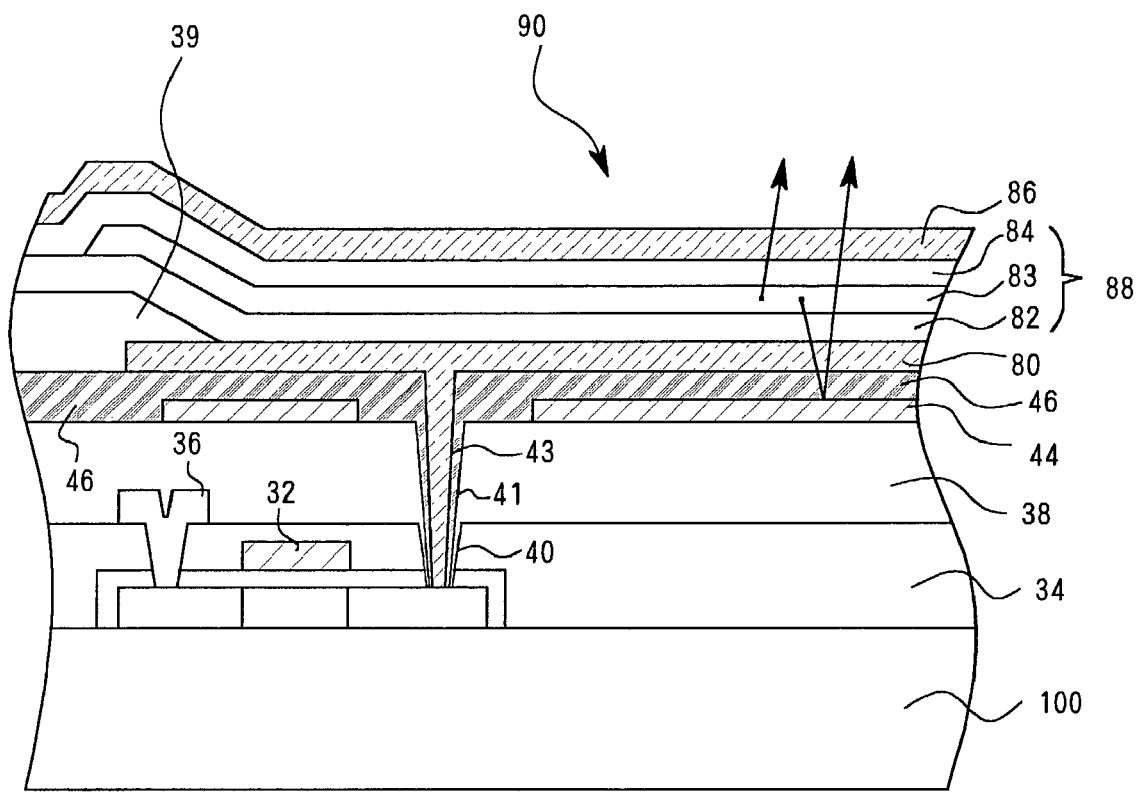
FIG. 5 is a schematic cross-sectional view of a structure of an active matrix-organic EL display apparatus according to the present invention.

Up to this point, the reflective and the transflective LCDs have been described. By applying the structure built by the switching element (TFT), the reflective layer, and the transparent first electrode according to the present invention to an EL display, it becomes possible to reliably connect the first electrode to the TFT proved on the lower layer while reflective function is established below the transparent first electrode. FIG. 5 shows a partial cross-sectional view of a structure on each pixel of an active matrix EL display apparatus according to the present embodiment.

An element adopted in an EL display apparatus depicted in FIG. 5 is an organic electroluminescence element 90 in which an organic compound is used as emissive material and an organic element layer 88 is formed between an anode 80 and a cathode 86. The organic element layer 88 comprises at least an emissive layer 83 including organic emissive functional molecules and may be configured in a single-layer structure or a multi-layer structure having two, three, or more layers depending on characteristics of the organic compound, emissive colors, and other properties. The organic element layer 88 in the example of FIG. 5 is provided with a positive hole transporting layer 82, an emissive layer 83, and an electron transporting layer 84 formed, in that order from the anode 80 side, on the substrate 100. The emissive layer 83 is individually patterned for each pixel, as is the anode 80, and the positive hole transporting layer 82 and the electron transporting layer 84 are commonly patterned for all pixels, as is the cathode 86. In order to insulate the anodes 80 from each other between adjacent pixels and to prevent shorts between the anode 80 and the cathode 86 on the edge region of the anode 80, the planarization insulating film 39 is formed on regions between the anodes of adjoining pixels.

In the organic EL element 90 having such structure as described above, when organic emissive molecules excited by recombination of positive holes injected from the anode 80 and electrons injected from the cathode 86 return to the ground state, light is emitted. Because the organic EL element 90 is, as described above, an emissive element driven by a current and the anode 80 should have a function of injecting sufficient positive holes into the organic element layer 88, the organic EL element 90 is often made of transparent conductive material such as ITO, IZO, or the like having a large work function. Accordingly, in most case, light from the emissive layer 83 is emitted toward the outside passing through the transparent substrate 100 from the anode 80 side, whereas in the active matrix organic EL display apparatus shown in FIG. 5, light can be emitted from the cathode side.

Figure 2:
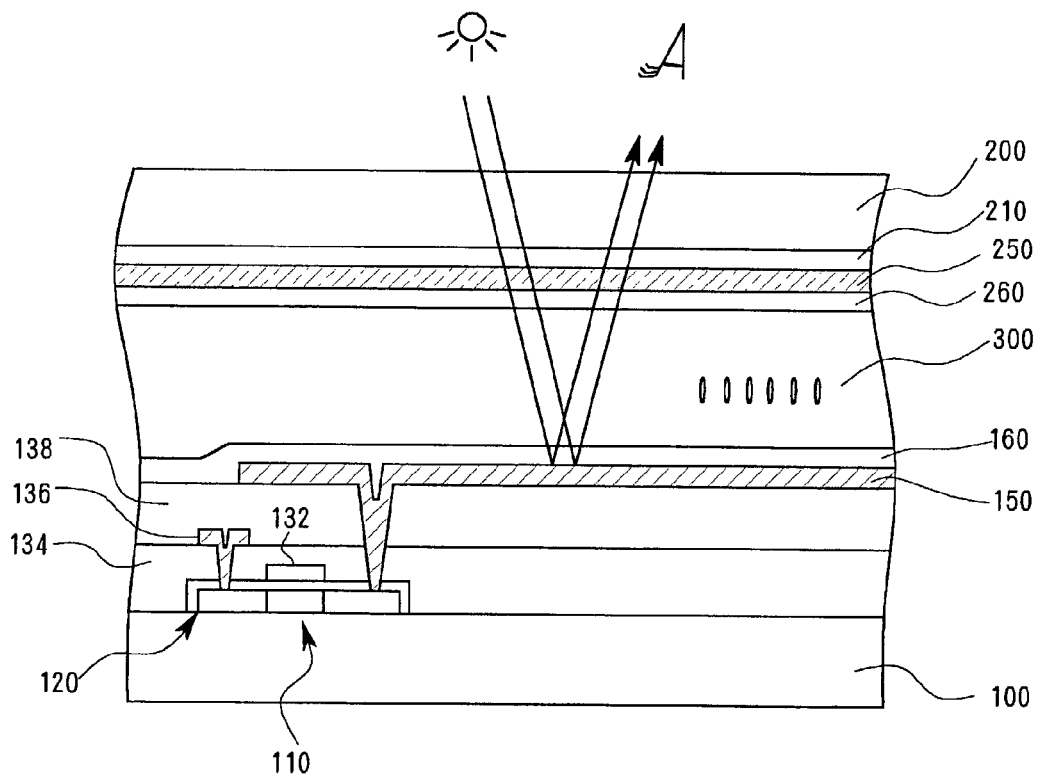
FIG. 2 is a schematic cross-sectional view of the structure of the reflective LCD of FIG. 1 along line C—C.

As the TFT 110 which drives the organic EL element 90, the reflective layer 44, the passivation film 46 which covers the reflective layer 44, and the anode 80 of the organic EL element 90 in the display apparatus of FIG. 5, for example, a similar structure built by the TFT 110, the reflective layer 44, the passivation film 46, and the first electrode 50 depicted in FIG. 2 may be adopted. That is, in a case wherein the anode 80 is formed by a transparent conductive material, the reflective layer 44 covered with the passivation film 46, insulated from the anode 80, and made of a material, such as an Al or Al—Nd alloy, having appropriate reflection properties is provided under the anode 80. Accordingly, by using the transparent conductive material such as ITO or IZO for the cathode 86 of the organic EL element 90 as in the case of the anode 80, or by forming the cathode 86 as a light transmittable thin film made of metal material such as Al or Ag (or by providing an opening on the cathode 86), a top emission structure in which light from the emissive layer 83 is emitted toward the outside from the cathode 86 side can be easily obtained. More specifically, because the reflective layer 44 is placed under the anode 80 as shown in FIG. 5, light traveling to the anode 80 side is reflected from the reflective layer 44, thereby enabling that light obtained in the emissive layer 83 is emitted from the cathode 86 side.

As has been described above, according to the present embodiment, even when either one of the substrates should have a reflection capability as is the case with reflective or transflective LCD, the first and second electrodes having equivalent characteristics can execute alternate-current driving of the liquid crystal layer with symmetry in a state where appropriate reflection properties are retained. Accordingly, it is possible to obtain a high-quality display without flicker or color persistence, even when a drive frequency of liquid crystal is established at a value equal to or lower than CFF.

What is claimed is:

1. A display apparatus configured by sandwiching a liquid crystal layer between a first substrate having a first electrode and a second substrate having a second electrode, wherein said first substrate further comprises:
    a switching element provided to each pixel and including a thin film transistor in which a gate is formed above an active layer;
    a gate insulating film including a silicon oxide and formed between said gate and said active layer of said thin film transistor;
    an interlayer insulating film formed covering said gate and said gate insulating film;
    a reflective layer formed above said interlayer insulating film so as to be insulated from said active layer of said film transistor, said reflective layer reflecting light incident from a side of said second substrate and said second electrode, both of which are transparent, into said liquid crystal layer, and
    a passivation film formed covering said reflective layer, and wherein
    said first electrode made of a transparent conductive material is electrically and directly connected to said active layer via a contact hole formed by opening a hole through at least said gate insulating film, said interlayer insulating film, and said passivation film which are formed between said first electrode and said active layer;
    said passivation film has endurance to a slight etching material which exposes a surface of said active layer made of silicon at a bottom of said contact hole; and
    said passivation film is made of a silicon oxide.

2. A display apparatus according to claim 1, wherein a difference between a work function of said transparent conductive material used for said first electrode and a work function of said transparent conductive material used for said second electrode formed on a liquid crystal layer side of said second substrate is less than or equal to 0.5 eV.

3. A display apparatus according to claim 1, wherein a difference between a work function of said transparent conductive material used for said first electrode and a work function of said transparent conductive material used for said second electrode formed on a liquid crystal layer side of said second substrate is less than or equal to 0.5 eV.

4. A display apparatus according to claim 1, wherein said display apparatus is a liquid crystal display apparatus and a driving frequency for said liquid crystal layer for each pixel is less than 60 Hz.

5. A display apparatus according to claim 1, wherein
    said display apparatus is a liquid crystal display apparatus,
    a difference between a work function of said transparent conductive material used for said first electrode and a work function of said transparent conductive material used for said second electrode formed on said liquid crystal layer side of said second substrate is less than or equal to 0.5 eV, and
    a driving frequency of said liquid crystal layer for each pixel is less than 60 Hz.

6. A display apparatus according to claim 1, wherein said reflective layer has an opening at least in a region of formation of said contact hole.

7. A display apparatus according to claim 6, wherein said reflective layer is formed covering almost an entire region of a pixel region other than a region of formation of said contact hole, and
    said apparatus is a reflective display apparatus in which light incident from the outside through said second substrate and said second electrode is reflected by said reflective layer to realize display.

8. A display apparatus according to claim 6, wherein said reflective layer is formed to cover a portion of a pixel region other than a region of formation of said contact hole,
    in a region of formation of said reflective layer, display is realized by reflecting, by said reflective layer, light incident from outside through said second substrate and said second electrode, and in a region in which said reflective layer is not formed, display is realized by emitting light from a light source provided on said first substrate side through said first substrate and said first electrode to said second substrate side.

9. A display apparatus according to claim 1, wherein said passivation film covers an inner wall of said contact hole including a region of said opening of said gate insulating film and said interlayer insulating film.

10. A display apparatus according to claim 1, wherein said passivation film further has an optical buffer function.

11. A display apparatus according to claim 1, wherein a surface of said reflective layer is slanted.

12. A display device according to claim 1, wherein a layer made of a refractory metal is provided as a lower buffer layer in said reflective layer.

13. A display apparatus according to claim 1, wherein a planarizing insulating layer formed covering said interlayer insulating film is provided between said reflective layer and said interlayer insulating film and an opening is formed through said planarizing insulating layer at a region in which said contact hole is formed.

14. A liquid crystal apparatus configured by sandwiching a liquid crystal layer between a first substrate having a first electrode and a second substrate having a second electrode, wherein said first substrate further comprises:

a switching element provided to each pixel and including a thin film transistor in which a gate is formed above an active layer;

a gate insulating film formed between said gate and said active layer of said thin film transistor;

an interlayer insulating layer formed covering said gate and said gate insulating film;

a first opening formed through said gate insulating film and said interlayer insulating film;

a planarizing insulating layer formed covering said interlayer insulating film;

a reflective layer formed above said planarizing insulating layer, selectively removed at a formation region of said first opening, and insulated from said active layer, said reflective layer reflecting light incident from a side of said second substrate and said second electrode, both of which are transparent, into said liquid crystal layer;

a second opening formed through said planarizing insulating layer at said formation region of said first opening; and a passivation film formed covering said reflective layer, and wherein a third opening is formed through said passivation film at a position overlapping said formation region of said first opening and a formation region of said second opening, said third opening having a smaller size than a size of said first opening and a size of said second opening;

said passivation film covers an inner wall of said contact hole including inner walls of said first opening and said second opening; and said passivation film is made of a silicon oxide.

15. A liquid crystal display apparatus according to claim 14, wherein said passivation film has endurance to a slight etching material which exposes a surface of said active layer made of silicon at a bottom of said contact hole.

16. A liquid crystal display apparatus according to claim 14, wherein said size of said second opening is smaller than said size of said first opening and said size of said third opening is smaller than said size of said second opening.

* * * * *